(12) United States Patent
Ueda et al.

(10) Patent No.: US 10,582,602 B2
(45) Date of Patent: Mar. 3, 2020

(54) EXTREME ULTRAVIOLET LIGHT GENERATION APPARATUS

(71) Applicant: Gigaphoton Inc., Tochigi (JP)

(72) Inventors: Atsushi Ueda, Tochigi (JP); Akihiro Takayama, Tochigi (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/536,055

(22) Filed: Aug. 8, 2019

(65) Prior Publication Data
US 2019/0364654 A1 Nov. 28, 2019

Related U.S. Application Data

(63) Continuation of application No. PCT/JP2017/013816, filed on Mar. 31, 2017.

(51) Int. Cl.
*H05G 2/00* (2006.01)
*G03F 7/20* (2006.01)

(52) U.S. Cl.
CPC ............. *H05G 2/008* (2013.01); *G03F 7/20* (2013.01); *G03F 7/70033* (2013.01)

(58) Field of Classification Search
CPC ........ H05G 2/008; G03F 7/70033; G03F 7/20
USPC .................... 250/504 R, 492.1, 492.2, 492.3
See application file for complete search history.

(56) References Cited

U.S. PATENT DOCUMENTS

| 7,655,925 B2* | 2/2010 | Bykanov | G03F 7/70033 250/428 |
|---|---|---|---|
| 2010/0019173 A1 | 1/2010 | Someya et al. | |
| 2012/0223257 A1* | 9/2012 | Nagai | G03F 7/70025 250/504 R |
| 2013/0161540 A1* | 6/2013 | Nagai | H05G 2/005 250/504 R |
| 2014/0217311 A1 | 8/2014 | Nishisaka | |

FOREIGN PATENT DOCUMENTS

| JP | 2008103206 A | 5/2008 |
|---|---|---|
| JP | 2009060139 A | 3/2009 |
| JP | 2013004369 A | 1/2013 |
| JP | 2013135033 A | 7/2013 |
| JP | 2014154616 A | 8/2014 |

OTHER PUBLICATIONS

International Search Report issued in PCT/JP2017/013816; dated Jun. 20, 2017.
International Preliminary Report on Patentability and Written Opinion issued in PCT/JP2017/013816; dated Oct. 1, 2019.

* cited by examiner

*Primary Examiner* — Michael Maskell
(74) *Attorney, Agent, or Firm* — Studebaker & Brackett PC

(57) ABSTRACT

An extreme ultraviolet light generation apparatus includes: a chamber; an EUV light focusing mirror located in the chamber; and a hydrogen gas release unit that is located in the chamber and includes an opening configured to release a hydrogen gas inward from around the EUV light focusing mirror and a first cooling medium channel through which a cooling medium passes.

14 Claims, 6 Drawing Sheets

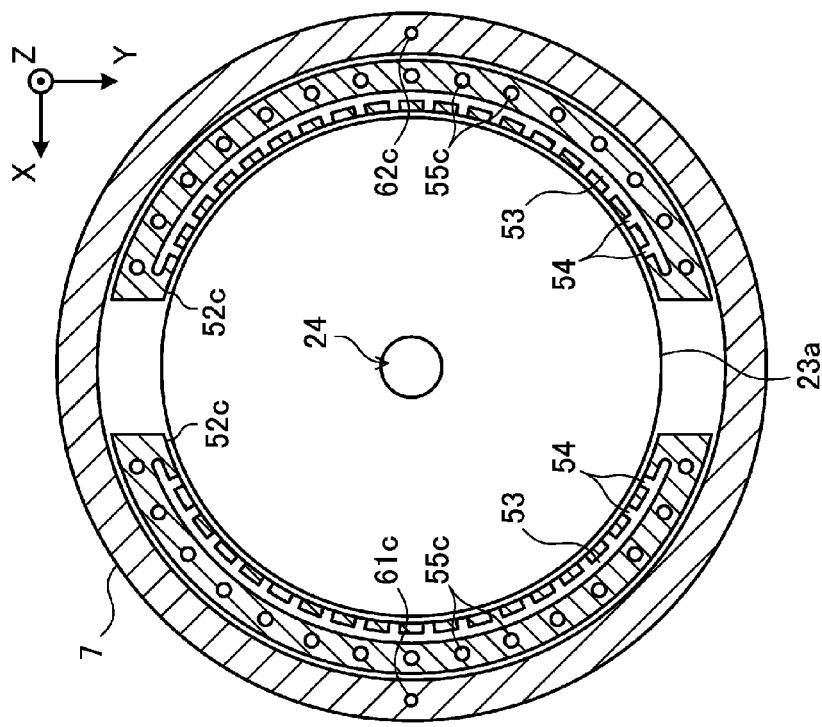
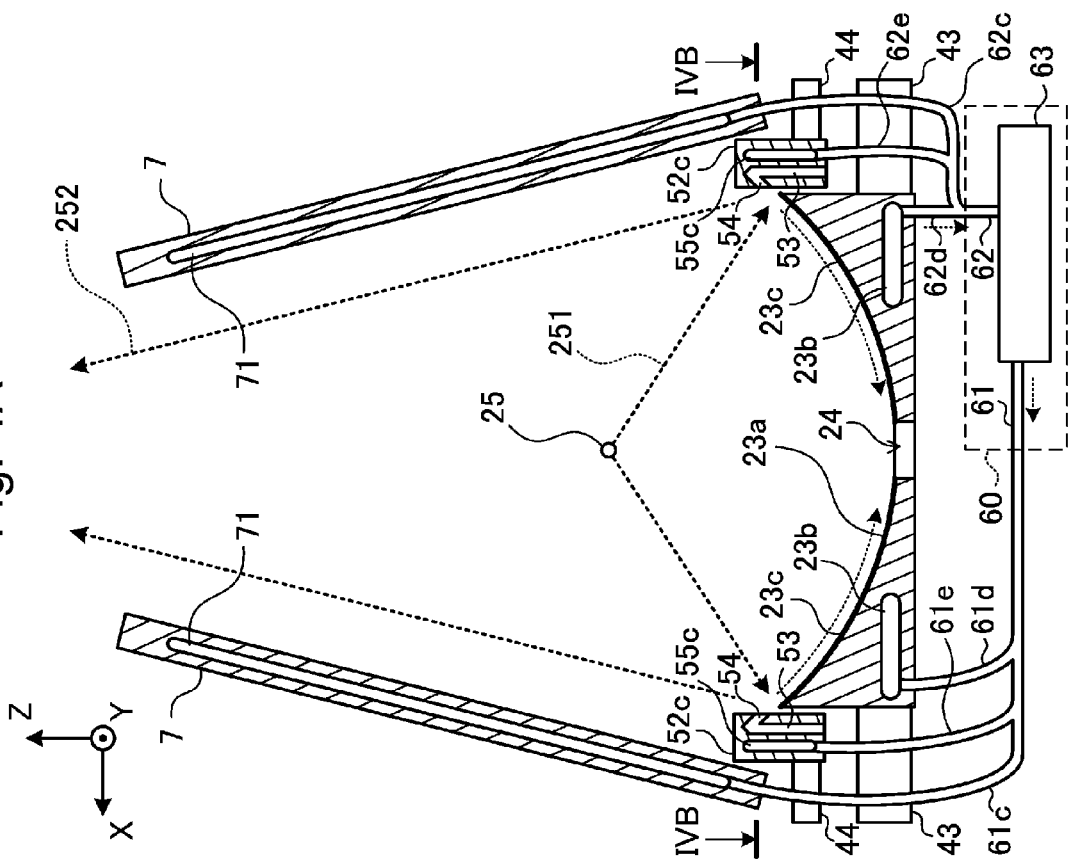

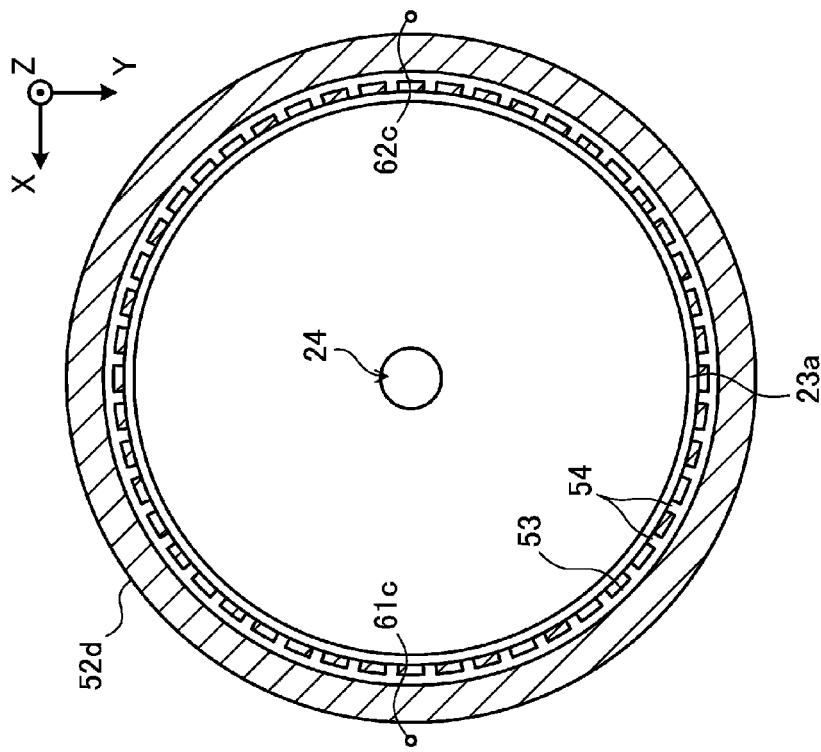
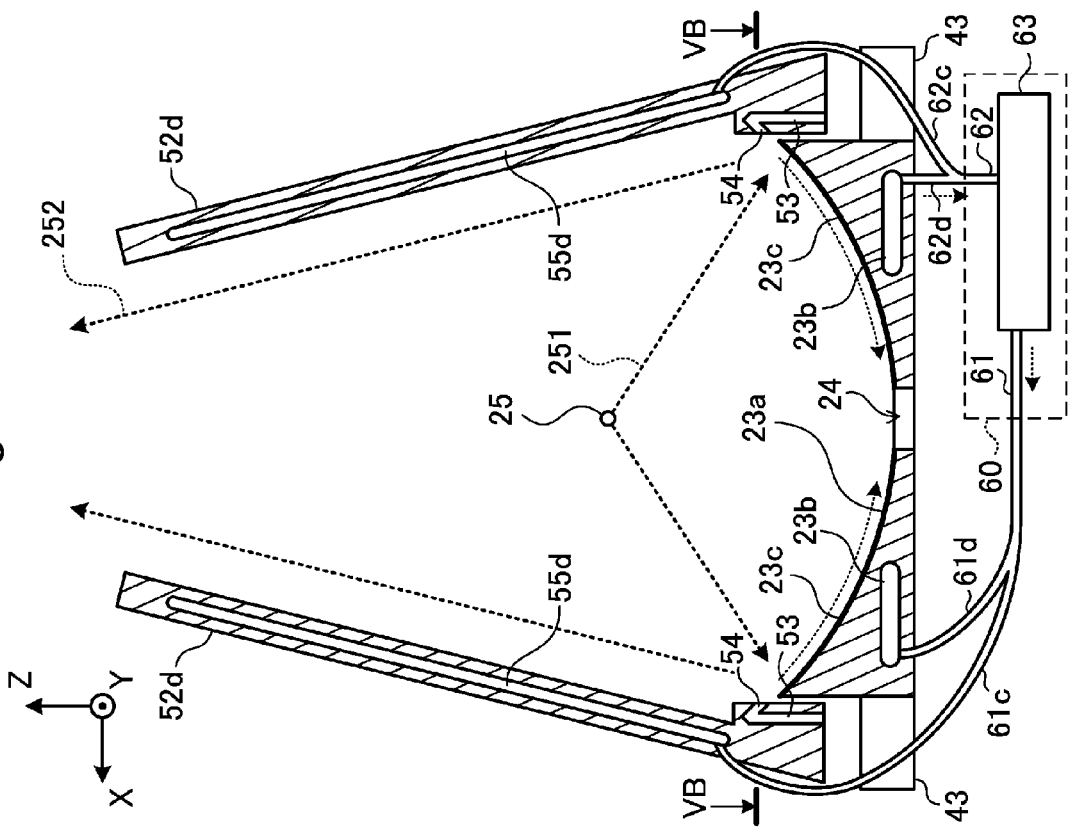

EXTREME ULTRAVIOLET LIGHT GENERATION APPARATUS

CROSS-REFERENCE TO RELATED APPLICATIONS

The present application is a continuation application of International Application No. PCT/JP2017/013816 filed on Mar. 31, 2017. The content of the application is incorporated herein by reference in its entirety.

BACKGROUND

1. Technical Field

The present disclosure relates to an extreme ultraviolet light generation apparatus.

2. Related Art

Recently, miniaturization of semiconductor processes has involved increasing miniaturization of transfer patterns for use in photolithography of the semiconductor processes. In the next generation, microfabrication at 70 nm to 45 nm and further microfabrication at 32 nm or less will be required. Thus, for example, to satisfy the requirement for the microfabrication at 32 nm or less, development of an exposure apparatus is expected including a combination of an extreme ultraviolet light generation apparatus configured to generate extreme ultraviolet (EUV) light having a wavelength of about 13 nm and reduced projection reflection optics.

Three types of EUV light generation apparatuses have been proposed: an LPP (Laser Produced Plasma) type apparatus using plasma generated by irradiating a target substance with a pulse laser beam, a DPP (Discharge Produced Plasma) type apparatus using plasma generated by discharge, and an SR (Synchrotron Radiation) type apparatus using synchrotron radiation.

LIST OF DOCUMENTS

Patent Documents

Patent Document 1: Japanese Unexamined Patent Application Publication No. 2009-060139
Patent Document 2: US Published Patent Application No. 2012/0223257

SUMMARY

An extreme ultraviolet light generation apparatus according to an aspect of the present disclosure includes: a chamber; an EUV light focusing mirror located in the chamber; and a hydrogen gas release unit that is located in the chamber and includes an opening configured to release a hydrogen gas inward from around the EUV light focusing mirror and a first cooling medium channel through which a cooling medium passes.

BRIEF DESCRIPTION OF THE DRAWINGS

With reference to the accompanying drawings, some embodiments of the present disclosure will be described below merely by way of example.

FIGS. 4A and 4B are sectional views of components included in a chamber 2a of an EUV light generation apparatus according to a first embodiment of the present disclosure.

FIGS. 5A and 5B are sectional views of components included in a chamber 2a of an EUV light generation apparatus according to a second embodiment of the present disclosure.

DESCRIPTION OF EMBODIMENTS

Figure 1:
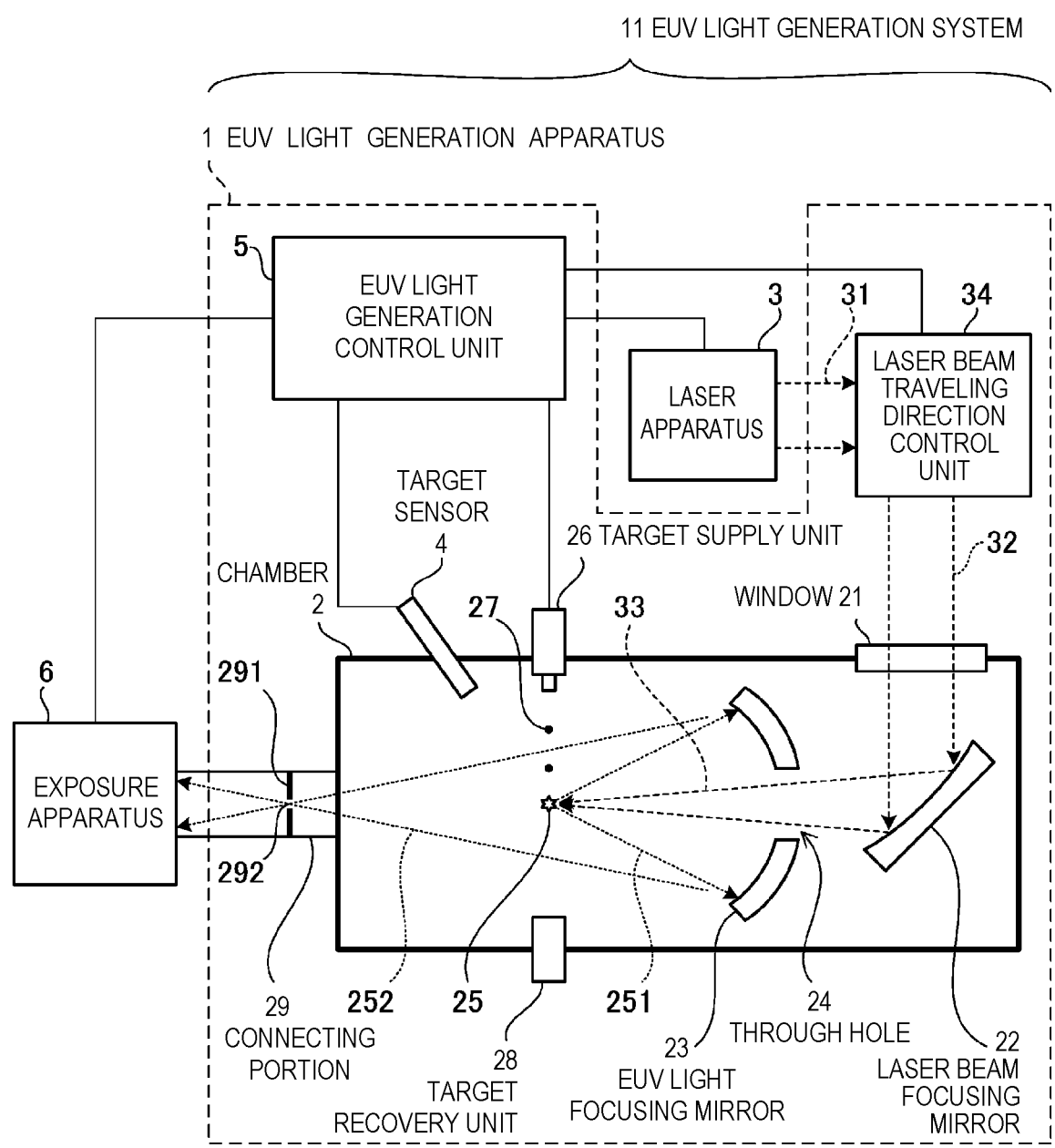
FIG. 1 schematically shows a configuration of an exemplary LPP type EUV light generation system.

<Contents>
1. General description of extreme ultraviolet light generation system
   1.1 Configuration
   1.2 Operation
2. EUV light generation apparatus according to comparative example
   2.1 Configuration
   2.2 Operation
   2.3 Problem
3. EUV light generation apparatus including cooling mechanism in hydrogen gas release unit
   3.1 Configuration
   3.2 Operation
   3.3 Effect
4. EUV light generation apparatus integrally including hydrogen gas release unit and shield
   4.1 Configuration
   4.2 Operation
   4.3 Effect
5. EUV light generation apparatus including expanded cooling medium channel
   5.1 Configuration and operation
   5.2 Effect
6. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. Like components are denoted by like reference numerals, and overlapping descriptions are omitted.

1. General Description of Extreme Ultraviolet Light Generation System

1.1 Configuration

FIG. 1 schematically shows a configuration of an exemplary LPP type EUV light generation system. An EUV light generation apparatus 1 is used together with at least one laser apparatus 3. In this application, a system including the EUV light generation apparatus 1 and the laser apparatus 3 is referred to as an EUV light generation system 11. As shown in FIG. 1 and described below in detail, the EUV light generation apparatus 1 includes a chamber 2 and a target supply unit 26. The chamber 2 is configured to be sealable.

The target supply unit 26 is mounted, for example, to extend through a wall of the chamber 2. A material of a target substance output from the target supply unit 26 includes tin. The material of the target substance may include any combinations of tin and terbium, gadolinium, lithium, or xenon.

The wall of the chamber 2 has at least one through hole. A window 21 is provided in the through hole. A pulse laser beam 32 output from the laser apparatus 3 passes through the window 21. In the chamber 2, an EUV light focusing mirror 23 having, for example, a spheroidal reflection surface is arranged. The EUV light focusing mirror 23 has first and second focal points. On a surface of the EUV light focusing mirror 23, a multilayer reflective film including, for example, alternately stacked molybdenum and silicon is formed. The EUV light focusing mirror 23 is arranged so that, for example, the first focal point is located in a plasma generating region 25 and the second focal point is located in an intermediate focal (IF) point 292. A through hole 24 is provided in a center of the EUV light focusing mirror 23. A pulse laser beam 33 passes through the through hole 24.

The EUV light generation apparatus 1 includes an EUV light generation control unit 5, a target sensor 4, and the like. The target sensor 4 has an imaging function, and is configured to detect presence, a trajectory, a position, a speed, or the like of a target 27.

The EUV light generation apparatus 1 includes a connecting portion 29 configured to provide communication between an interior of the chamber 2 and an interior of an exposure apparatus 6. In the connecting portion 29, a wall 291 having an aperture is provided. The wall 291 is arranged so that the aperture is located in a second focal position of the EUV light focusing mirror 23.

Further, the EUV light generation apparatus 1 includes a laser beam traveling direction control unit 34, a laser beam focusing mirror 22, a target recovery unit 28 for recovering the target 27, and the like. The laser beam traveling direction control unit 34 includes an optical element for defining a traveling direction of a laser beam, and an actuator for adjusting a position, an orientation, or the like of the optical element.

1.2 Operation

With reference to FIG. 1, a pulse laser beam 31 output from the laser apparatus 3 passes through the laser beam traveling direction control unit 34 and passes through the window 21 as the pulse laser beam 32, which enters the chamber 2. The pulse laser beam 32 travels along at least one laser beam path in the chamber 2, is reflected by the laser beam focusing mirror 22, and is applied as the pulse laser beam 33 to at least one target 27.

The target supply unit 26 outputs the target 27 toward the plasma generating region 25 in the chamber 2. The target 27 is irradiated with at least one pulse included in the pulse laser beam 33. The target 27 irradiated with the pulse laser beam is turned into plasma, and radiation light 251 is radiated from the plasma. The EUV light focusing mirror 23 reflects EUV light included in the radiation light 251 with higher reflectance than light in a different wavelength range. Reflected light 252 including the EUV light reflected by the EUV light focusing mirror 23 is focused at the intermediate focal point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes image date or the like of the target 27 captured by the target sensor 4. Also, the EUV light generation control unit 5 controls, for example, output timing of the target 27, an output direction of the target 27, or the like. Further, the EUV light generation control unit 5 controls, for example, oscillation timing of the laser apparatus 3, a traveling direction of the pulse laser beam 32, a focusing position of the pulse laser beam 33, or the like. These various kinds of control are mere exemplary, and may include other control as necessary.

Figure 2:
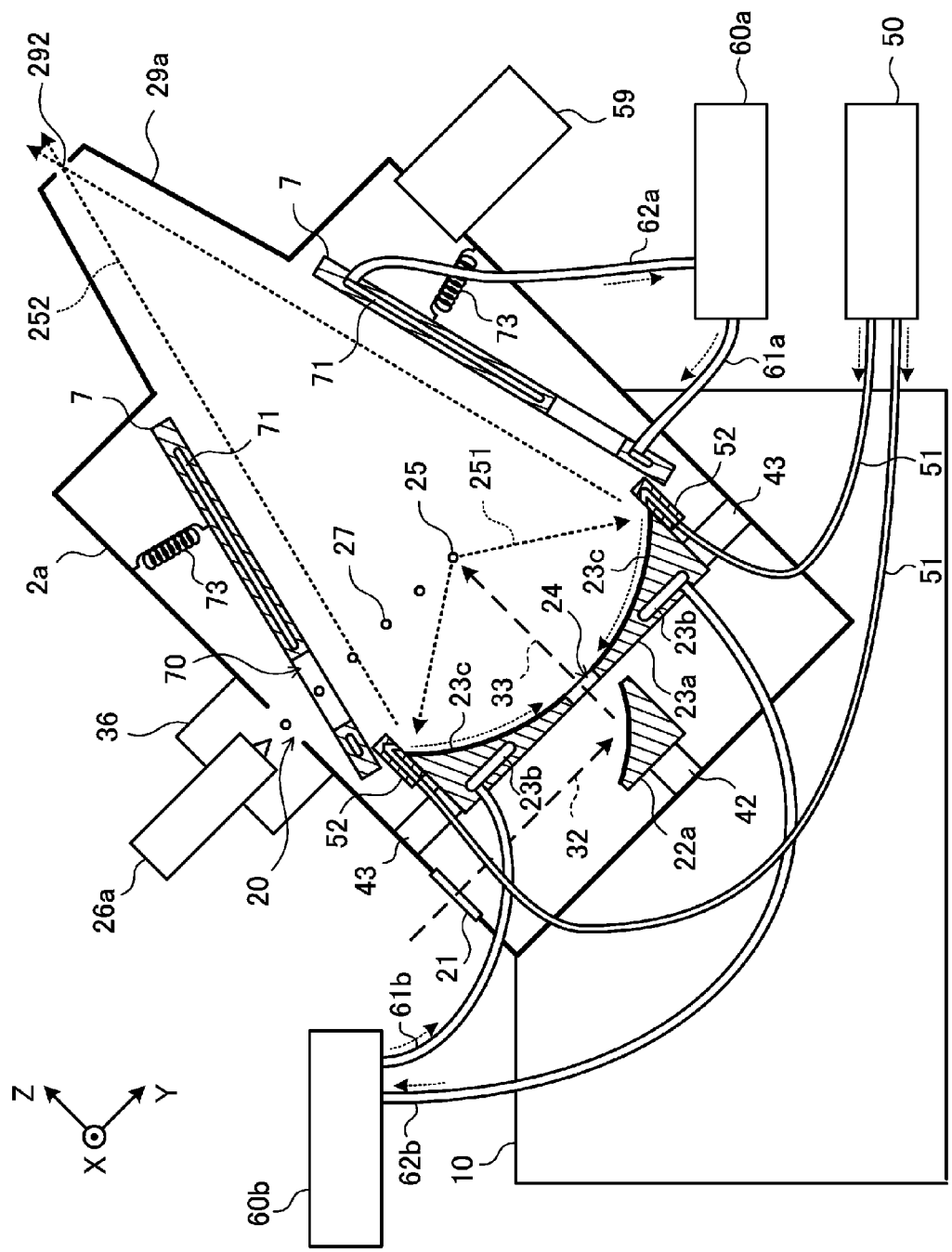
FIG. 2 schematically shows a configuration of an EUV light generation apparatus according to a comparative example of the present disclosure.
Figure 3B:
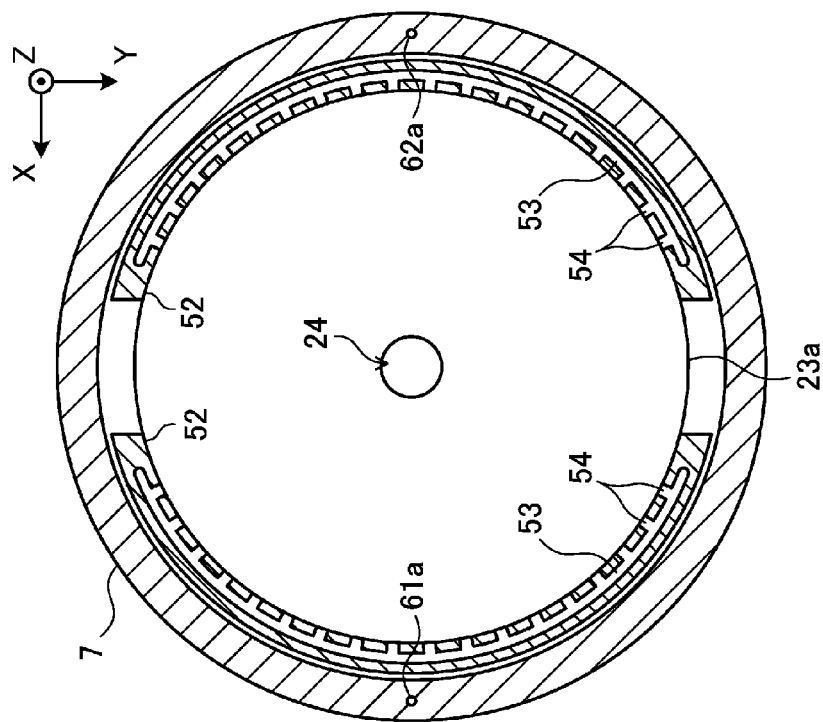
FIGS. 3A and 3B are sectional views of components included in a chamber 2a of the EUV light generation apparatus in FIG. 2.
Figure 3A:
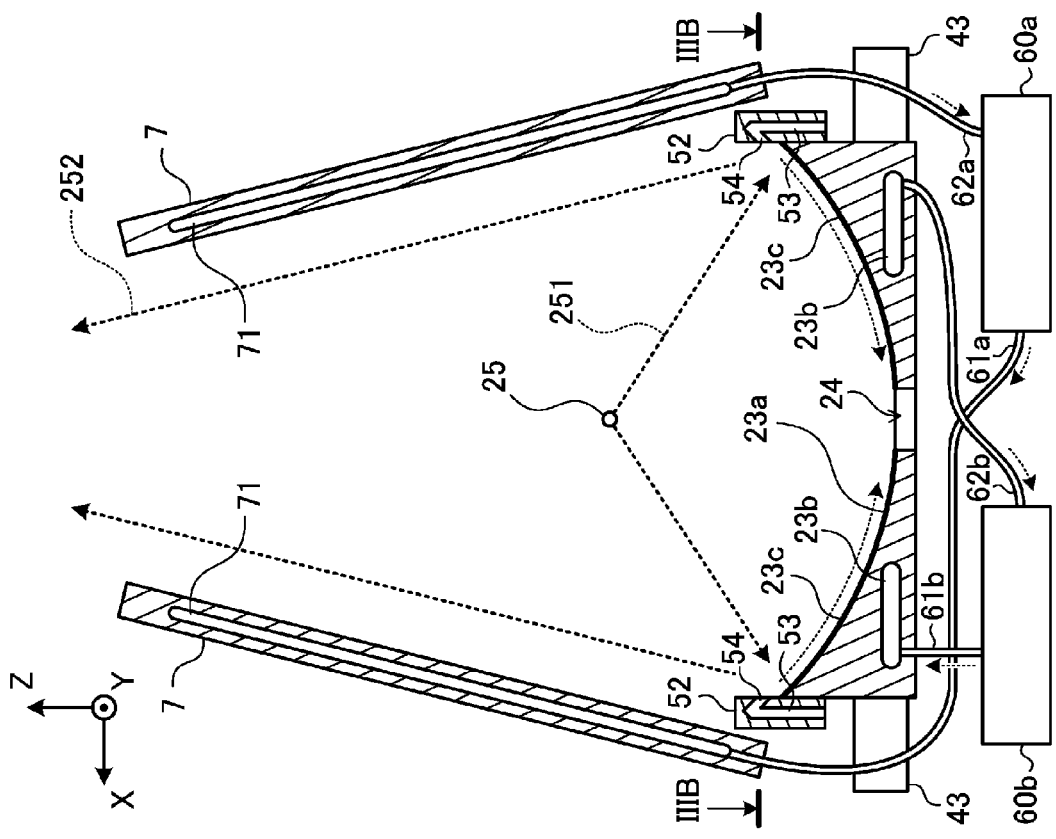

2. EUV Light Generation Apparatus According to Comparative Example 2.1 Configuration FIG. 2 schematically shows a configuration of an EUV light generation apparatus according to a comparative example of the present disclosure. FIGS. 3A and 3B are sectional views of components included in a chamber 2a of the EUV light generation apparatus in FIG. 2. FIG. 3B is a sectional view taken along the line IIIB-IIIB in FIG. 3A. Specifically, FIG. 3B shows a section through a plurality of openings 54 described later. FIGS. 3A and 3B do not show the chamber 2a, a laser beam focusing mirror 22a, a hydrogen gas supply unit 50, a hydrogen gas supply pipe 51, and the like in FIG. 2.

As shown in FIG. 2, the chamber 2a is held inclined to a gravity direction by a chamber holding member 10. A holding portion 36, an exhaust device 59, and a connecting portion 29a are mounted to an outside of the chamber 2a. Further, the hydrogen gas supply unit 50, a cooling medium supply unit 60a, and a cooling medium supply unit 60b are provided outside the chamber 2a. In the description below, an output direction of EUV light is a +Z direction. An output direction of a target 27 is a +Y direction. A direction perpendicular to the +Z direction and the Y direction is an X direction.

A target supply unit 26a is mounted via the holding portion 36 to the chamber 2a. The chamber 2a has a through hole 20, and the holding portion 36 is removably arranged on the outside of the chamber 2a so as to cover the through hole 20.

The hydrogen gas supply unit 50 may include a cylinder (not shown) holding a hydrogen gas, and a massflow controller or an on-off valve (not shown). The hydrogen gas supply unit 50 includes at least one hydrogen gas supply pipe 51. The hydrogen gas supply pipe 51 extends through a wall surface of the chamber 2a and connects to a hydrogen gas release unit 52. As shown in FIGS. 3A and 3B, the hydrogen gas release unit 52 includes the openings 54, and a hydrogen gas channel 53 through which a hydrogen gas passes from the hydrogen gas supply pipe 51 to the openings 54. The openings 54 are annularly arranged along an outer periphery of an EUV light focusing mirror 23a.

The exhaust device 59 includes an exhaust pump (not shown). The exhaust device 59 uses the exhaust pump to exhaust a gas in the chamber 2a.

In the chamber 2a, the EUV light focusing mirror 23a, the laser beam focusing mirror 22a, and a shield member 7 are provided.

The shield member 7 is supported in the chamber 2a by a plurality of extensible members 73 (see FIG. 2). The EUV light focusing mirror 23a is supported in the chamber 2a by an EUV light focusing mirror holder 43. The laser beam focusing mirror 22a is supported in the chamber 2a by a holder 42. The laser beam focusing mirror 22a is formed as an off axis parabolic mirror. A focal point of the off axis parabolic mirror is located in a plasma generating region 25. The plasma generating region 25 corresponds to a predetermined region in the present disclosure.

The shield member 7 has a tapered cylindrical shape with a large diameter on a −Z direction side and a small diameter on a +Z direction side. The shield member 7 is located to surround an optical path of reflected light 252 including EUV light reflected by the EUV light focusing mirror 23a. An end of the shield member 7 on the −Z direction side is located near the outer periphery of the EUV light focusing mirror 23a. An end of the shield member 7 on the +Z direction side is located on a downstream side of the optical path of the reflected light 252 including the EUV light reflected by the EUV light focusing mirror 23a.

The shield member 7 has a through hole 70. The through hole 70 is located on a trajectory of the target 27 between the target supply unit 26a and the plasma generating region 25.

The shield member 7 includes a cooling medium channel 71 through which a liquid cooling medium passes. The cooling medium channel 71 corresponds to a third cooling medium channel in the present disclosure. As the cooling medium, for example, water is used. The cooling medium channel 71 is connected via a cooling medium supply pipe 61a to the cooling medium supply unit 60a. Further, the cooling medium channel 71 is connected via a cooling medium discharge pipe 62a to the cooling medium supply unit 60a.

The EUV light focusing mirror 23a includes a cooling medium channel 23b through which a liquid cooling medium passes. The cooling medium channel 23b corresponds to a second cooling medium channel in the present disclosure. As the cooling medium, for example, water is used. The cooling medium channel 23b is connected via a cooling medium supply pipe 61b to the cooling medium supply unit 60b. Further, the cooling medium channel 23b is connected via a cooling medium discharge pipe 62b to the cooling medium supply unit 60b.

2.2 Operation

The target supply unit 26a outputs a tin droplet as the target 27. The target 27 output from the target supply unit 26a passes through the through hole 20 in the chamber 2a and the through hole 70 in the shield member 7, and reaches the plasma generating region 25. A pulse laser beam 32 passes through a window 21 and enters the laser beam focusing mirror 22a in the chamber 2a. A pulse laser beam 33 reflected by the laser beam focusing mirror 22a is focused on the plasma generating region 25. The pulse laser beam 33 reaches the plasma generating region 25 at timing when the target 27 reaches the plasma generating region 25.

The target 27 irradiated with the pulse laser beam 33 is turned into plasma. Radiation light 251 is radiated from the plasma. Tin debris is also generated from the plasma. The tin debris adhering to a reflection surface 23c of the EUV light focusing mirror 23a may reduce reflectance of the reflection surface 23c. Thus, the hydrogen gas supply unit 50 supplies the hydrogen gas to the hydrogen gas release unit 52. The hydrogen gas is released through the openings 54 in the hydrogen gas release unit 52. The hydrogen gas flows inward from around the EUV light focusing mirror 23a along the reflection surface 23c of the EUV light focusing mirror 23a. The hydrogen gas etches tin adhering to the reflection surface 23c. Specifically, a hydrogen radical resulting from excitation of hydrogen reacts with metallic tin into stannane, and thus tin is etched from the reflection surface 23c. The hydrogen radical is generated by the hydrogen gas being excited with the EUV light or the like. The exhaust device 59 exhausts the hydrogen gas released from the hydrogen gas release unit 52 or a stannane gas generated by the reaction between hydrogen and tin.

Radiation heat is also generated from the plasma. The shield member 7 absorbs the heat radiated from the plasma. The heat absorbed by the shield member 7 is discharged out of the chamber 2a by the cooling medium flowing through the cooling medium channel 71. This prevents deformation of the chamber 2a due to heat. The EUV light focusing mirror 23a is also cooled by the cooling medium flowing through the cooling medium channel 23b. This prevents deformation of the EUV light focusing mirror 23a due to heat.

The stannane may be separated into hydrogen and tin near a hot component, and tin may be deposited on a surface of the component. Thus, the EUV light focusing mirror 23a and the shield member 7 are cooled to a temperature range at which separation of stannane into hydrogen and tin can be prevented.

2.3 Problem

Besides the EUV light focusing mirror 23a and the shield member 7, the hydrogen gas release unit 52 may be also heated, and tin may be deposited on a surface of the hydrogen gas release unit 52. The tin deposited on the surface of the hydrogen gas release unit 52 may cause a change in shape of the openings 54 through which the hydrogen gas is released, and a desired gas flow sometimes cannot be obtained. If there is no component for blocking the radiation heat from the plasma between the plasma generating region 25 and the openings 54 in the hydrogen gas release unit 52, and the radiation heat from the plasma directly enters areas around the openings 54 in the hydrogen gas release unit 52, the areas around the openings 54 may be particularly heated and tin may be deposited thereon.

Cooling the hydrogen gas release unit 52 is considered so as to prevent deposition of tin on the surface of the hydrogen gas release unit 52. As a method for cooling the hydrogen gas release unit 52, the hydrogen gas release unit 52 may be brought close and secured to the EUV light focusing mirror 23a by a screw or the like.

However, with the method in which the hydrogen gas release unit 52 is brought close and secured to the EUV light focusing mirror 23a, heat conduction from the hydrogen gas release unit 52 to the EUV light focusing mirror 23a may be insufficient for cooling the hydrogen gas release unit 52. Also, pressing the hydrogen gas release unit 52 hard against the EUV light focusing mirror 23a for securing may deform the EUV light focusing mirror 23a. The deformation of the EUV light focusing mirror 23a may affect EUV light focusing performance of the EUV light focusing mirror 23a.

In an embodiment described below, a hydrogen gas release unit 52 includes a cooling mechanism. This prevents heating of the hydrogen gas release unit 52, and prevents deposition of tin on a surface of the hydrogen gas release unit 52.

3. EUV Light Generation Apparatus Including Cooling Mechanism in Hydrogen Gas Release Unit 3.1 Configuration FIGS. 4A and 4B are sectional views of components included in a chamber 2a of an EUV light generation apparatus according to a first embodiment of the present disclosure. FIG. 4B is a sectional view taken along the line IVB-IVB in FIG. 4A. Specifically, FIG. 4B shows a section through a plurality of openings 54. FIGS. 4A and 4B do not show the chamber 2a, a laser beam focusing mirror 22a, a hydrogen gas supply unit 50, a hydrogen gas supply pipe 51, and the like. Configurations of the chamber 2a, the laser beam focusing mirror 22a, the hydrogen gas supply unit 50, and the like of the EUV light generation apparatus according to the first embodiment are similar to those described with reference to FIG. 2.

In the first embodiment, a hydrogen gas release unit 52c is supported in the chamber 2a by a holder 44. The hydrogen gas release unit 52c includes a cooling medium channel 55c through which a liquid cooling medium passes. As the cooling medium, for example, water is used. The cooling medium channel 55c formed in the hydrogen gas release unit 52c corresponds to a first cooling medium channel in the present disclosure. The cooling medium channel 55c is formed outside a hydrogen gas channel 53 provided in the hydrogen gas release unit 52c. Specifically, the hydrogen gas channel 53 is located between the cooling medium channel 55c and an EUV light focusing mirror 23a. The cooling medium channel 55c passes through a section of the hydrogen gas release unit 52c at a plurality of spots, the section passing through the openings 54 in FIG. 4B. Thus, the cooling medium flows near the openings 54 to cool areas around the openings 54. The spots are desirably annularly arranged in the section in FIG. 4B. The spots are desirably arranged substantially at regular intervals in the section in FIG. 4B. The spots may be arranged correspondingly to the openings 54 in the section in FIG. 4B.

A cooling medium supply unit 60 includes a cooling medium supply pipe 61, a cooling medium discharge pipe 62, and a temperature adjustor 63. The temperature adjustor 63 is connected to the cooling medium supply pipe 61 and the cooling medium discharge pipe 62. The cooling medium supply pipe 61 or the cooling medium discharge pipe 62 includes a pump (not shown).

The cooling medium supply pipe 61 branches into, for example, three supply pipes 61c, 61d, 61e. The supply pipe 61c is connected to a cooling medium channel 71, the supply pipe 61d is connected to a cooling medium channel 23b, and further, the supply pipe 61e is connected to the cooling medium channel 55c.

The cooling medium discharge pipe 62 branches into, for example, three discharge pipes 62c, 62d, 62e. The discharge pipe 62c is connected to the cooling medium channel 71, the discharge pipe 62d is connected to the cooling medium channel 23b, and further, the discharge pipe 62e is connected to the cooling medium channel 55c.

The supply pipes 61c, 61d, 61e each may include a valve or a flow regulator (not shown). Alternatively, the discharge pipes 62c, 62d, 62e each may include a valve or a flow regulator (not shown).

One supply pipe 61e and one discharge pipe 62e are shown, but when a plurality of hydrogen gas release units 52c are provided as shown in FIG. 4B, a plurality of supply pipes 61e and a plurality of discharge pipes 62e may be provided.

3.2 Operation

The temperature adjustor 63 of the cooling medium supply unit 60 supplies the cooling medium via the common cooling medium supply pipe 61 to the cooling medium channel 71, the cooling medium channel 23b, and the cooling medium channel 55c. Thus, the temperature adjustor 63 supplies the cooling medium at substantially the same temperature to the cooling medium channel 71, the cooling medium channel 23b, and the cooling medium channel 55c. The temperature of the cooling medium is, for example, 0° C. or higher and 5° C. or lower. Thus, a shield member 7, the EUV light focusing mirror 23a, and the hydrogen gas release unit 52c are cooled to a temperature range at which separation of stannane into hydrogen and tin can be prevented.

Other aspects are similar to those in the comparative example.

3.3 Effect

According to the first embodiment, the cooling medium cools the hydrogen gas release unit 52c to prevent deposition of tin on a surface of the hydrogen gas release unit 52c. This prevents a change in shape of the openings 54 in the hydrogen gas release unit 52c, and prevents a change in flow of a hydrogen gas.

Also, according to the first embodiment, the hydrogen gas release unit 52c is supported by the holder 44 independently of the EUV light focusing mirror 23a. Thus, the hydrogen gas release unit 52c can be held without being pressed against the EUV light focusing mirror 23a, thereby preventing deformation of the EUV light focusing mirror 23a.

Also, according to the first embodiment, the hydrogen gas channel 53 is located between the cooling medium channel 55c and the EUV light focusing mirror 23a. Thus, the hydrogen gas release unit 52c can be arranged with a short distance between the EUV light focusing mirror 23a and the openings 54. This can optimize the flow of the hydrogen gas along a reflection surface 23c of the EUV light focusing mirror 23a.

4. EUV Light Generation Apparatus Integrally Including Hydrogen Gas Release Unit and Shield 4.1 Configuration FIGS. 5A and 5B are sectional views of components included in a chamber 2a of an EUV light generation apparatus according to a second embodiment of the present disclosure. FIG. 5B is a sectional view taken along the line VB-VB in FIG. 5A. Specifically, FIG. 5B shows a section through a plurality of openings 54. FIGS. 5A and 5B do not show the chamber 2a, a laser beam focusing mirror 22a, a hydrogen gas supply unit 50, a hydrogen gas supply pipe 51, and the like. Configurations of the chamber 2a, the laser beam focusing mirror 22a, the hydrogen gas supply unit 50, and the like of the EUV light generation apparatus according to the second embodiment are similar to those described with reference to FIG. 2.

In the second embodiment, a hydrogen gas release unit 52d also serves as a shield. Specifically, the hydrogen gas release unit 52d is a member integrally including a part corresponding to the hydrogen gas release unit 52c in the first embodiment and a part corresponding to the shield member 7 in the first embodiment. In this point, the second embodiment is different from the first embodiment in which the hydrogen gas release unit 52c is separate from the shield member 7. In the second embodiment, the hydrogen gas release unit 52d is supported in the chamber 2a by extensible members 73 (see FIG. 2). A cooling medium channel 55d is formed in the hydrogen gas release unit 52d. The cooling medium channel 55d corresponds to a first cooling medium channel in the present disclosure.

A cooling medium supply unit 60 includes a cooling medium supply pipe 61, a cooling medium discharge pipe 62, and a temperature adjustor 63. The temperature adjustor 63 is connected to the cooling medium supply pipe 61 and the cooling medium discharge pipe 62. The cooling medium supply pipe 61 or the cooling medium discharge pipe 62 includes a pump (not shown).

The cooling medium supply pipe 61 branches into, for example, two supply pipes 61c, 61d. The supply pipe 61c is connected to the cooling medium channel 55d, and the supply pipe 61d is connected to a cooling medium channel 23b.

The supply pipes 61c, 61d each may include a valve or a flow regulator (not shown). Alternatively, discharge pipes 62c, 62d each may include a valve or a flow regulator (not shown).

The cooling medium discharge pipe 62 branches into, for example, two discharge pipes 62c, 62d. The discharge pipe 62c is connected to the cooling medium channel 55d, and the discharge pipe 62d is connected to the cooling medium channel 23b.

4.2 Operation

The temperature adjustor 63 supplies a cooling medium via the common cooling medium supply pipe 61 to the cooling medium channel 55d and the cooling medium channel 23b. Thus, the temperature adjustor 63 supplies the cooling medium at substantially the same temperature to the cooling medium channel 55d and the cooling medium channel 23b. Thus, the hydrogen gas release unit 52d and an EUV light focusing mirror 23a are cooled to a temperature range at which separation of stannane into hydrogen and tin can be prevented.

Other aspects are similar to those in the comparative example.

4.3 Effect

According to the second embodiment, the cooling medium cools the hydrogen gas release unit 52d to prevent deposition of tin on a surface of the hydrogen gas release unit 52d. This prevents a change in shape of openings 54 in the hydrogen gas release unit 52d, and prevents a change in flow of a hydrogen gas.

Also, according to the second embodiment, the hydrogen gas release unit 52d that also serves as the shield is supported by the extensible members 73. Thus, the hydrogen gas release unit 52d can be held without being pressed against the EUV light focusing mirror 23a, thereby preventing deformation of the EUV light focusing mirror 23a.

In the first embodiment, the shield member 7 is arranged to surround the separate hydrogen gas release unit 52c, while in the second embodiment, the hydrogen gas release unit 52d also serves as the shield, and the hydrogen gas release unit 52d and the shield are integrated. Thus, in the second embodiment, the hydrogen gas release unit 52d that also serves as the shield can have an outer diameter smaller than an outer size of the shield member 7 in the first embodiment.

5. EUV Light Generation Apparatus Including Expanded Cooling Medium Channel

5.1 Configuration and Operation

Figure 6B:
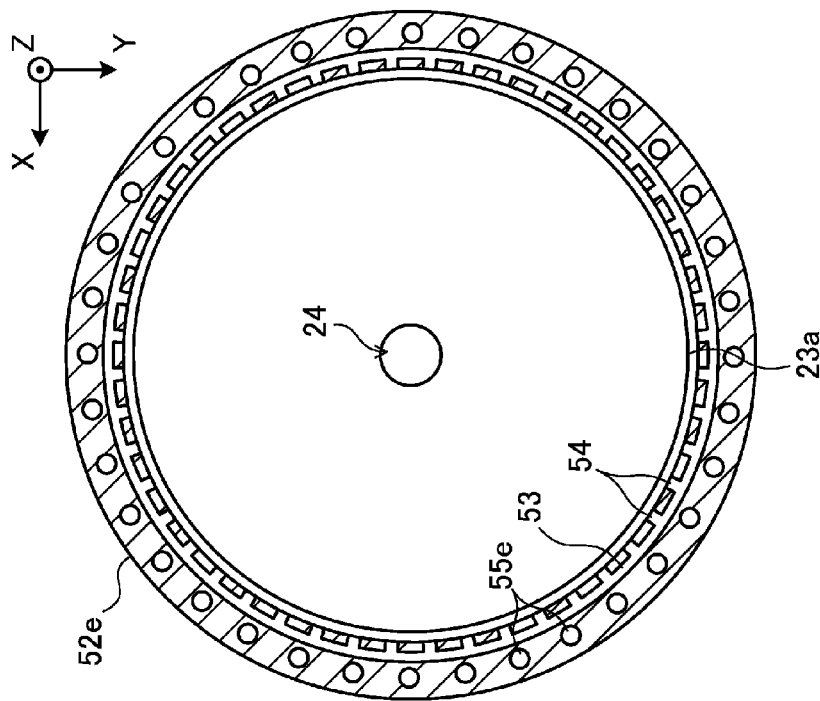
FIGS. 6A and 6B are sectional views of components included in a chamber 2a of an EUV light generation apparatus according to a third embodiment of the present disclosure.
Figure 6A:
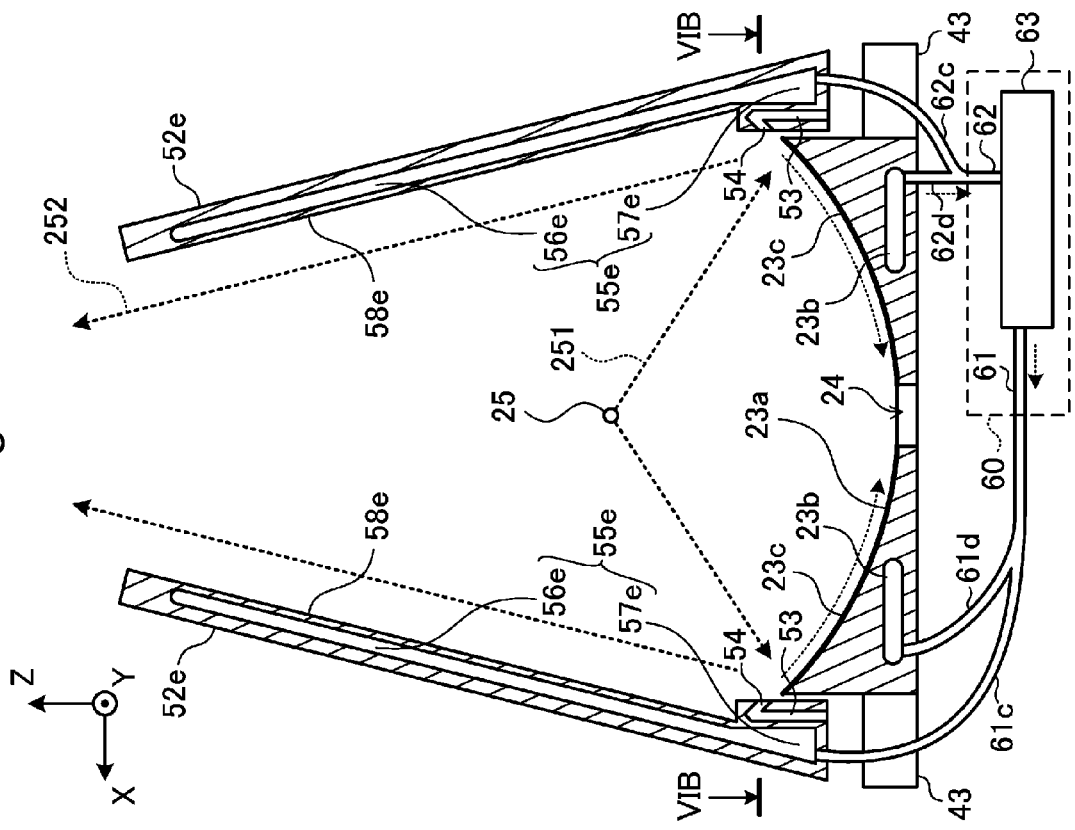

FIGS. 6A and 6B are sectional views of components included in a chamber 2a of an EUV light generation apparatus according to a third embodiment of the present disclosure. FIG. 6B is a sectional view taken along the line VIB-VIB in FIG. 6A. Specifically, FIG. 6B shows a section through a plurality of openings 54. FIGS. 6A and 6B do not show the chamber 2a, a laser beam focusing mirror 22a, a hydrogen gas supply unit 50, a hydrogen gas supply pipe 51, and the like. Configurations of the chamber 2a, the laser beam focusing mirror 22a, the hydrogen gas supply unit 50, and the like of the EUV light generation apparatus according to the third embodiment are similar to those described with reference to FIG. 2.

In the third embodiment, a cooling medium channel 55e is formed in a hydrogen gas release unit 52e that also serves a shield. The cooling medium channel 55e corresponds to a first cooling medium channel in the present disclosure. The cooling medium channel 55e passes through a section of the hydrogen gas release unit 52e at a plurality of spots, the section passing through the openings 54 in FIG. 6B. The cooling medium channel 55e includes a first part 56e and a second part 57e. The first part 56e is located on a +Z direction side of the openings 54 in the hydrogen gas release unit 52e, and the second part 57e is located on a −Z direction side of the openings 54 in the hydrogen gas release unit 52e.

5.2 Effect

According to the third embodiment, the first part 56e is located on the +Z direction side of the openings 54, and the second part 57e is located on the −Z direction side of the openings 54. Thus, areas around the openings 54 in the hydrogen gas release unit 52e are efficiently cooled from both the +Z direction side and the −Z direction side, thereby preventing deposition of tin around the openings 54.

Also in the third embodiment, the cooling medium channel 55e is formed closer to an inner surface 58e of the hydrogen gas release unit 52e. Reducing a distance between the cooling medium channel 55e and the inner surface 58e can easily reduce a temperature of the inner surface 58e of the hydrogen gas release unit 52e. This can also easily reduce a temperature around the openings 54 formed in the hydrogen gas release unit 52e.

Other aspects are similar to those in the second embodiment.

6. Others

The above descriptions are intended to be illustrative only and not restrictive. Thus, it will be apparent to those skilled in the art that modifications may be made in the embodiments of the present disclosure without departing from the scope of the appended claims.

The terms used throughout the specification and the appended claims should be interpreted as "non-limiting." For example, the term "comprising" or "comprised" should be interpreted as "not limited to what has been described as being comprised." The term "having" should be interpreted as "not limited to what has been described as having". Further, the modifier "a/an" described in the specification and the appended claims should be interpreted to mean "at least one" or "one or more".

What is claimed is:

1. An extreme ultraviolet (EUV) light generation apparatus comprising:
   a chamber;
   an EUV light focusing mirror located in the chamber; and
   a hydrogen gas release unit that is located in the chamber and includes an opening configured to release a hydrogen gas inward from around the EUV light focusing mirror and a first cooling medium channel through which a cooling medium passes.

2. The extreme ultraviolet light generation apparatus according to claim 1, further comprising a cooling medium supply unit,
   wherein the EUV light focusing mirror includes a second cooling medium channel through which a cooling medium passes, and
   the cooling medium supply unit includes a common cooling medium supply pipe configured to supply the cooling medium to the first cooling medium channel and the second cooling medium channel.

3. The extreme ultraviolet light generation apparatus according to claim 1, further comprising a cooling medium supply unit,
   wherein the EUV light focusing mirror includes a second cooling medium channel through which a cooling medium passes, and
   the cooling medium supply unit is configured to supply the cooling medium at substantially the same temperature to the first cooling medium channel and the second cooling medium channel.

4. The extreme ultraviolet light generation apparatus according to claim 3, wherein a temperature of the cooling medium supplied to the first cooling medium channel and the second cooling medium channel by the cooling medium supply unit is 0° C. or higher to 5° C. or lower.

5. The extreme ultraviolet light generation apparatus according to claim 1, further comprising a holder configured to hold the hydrogen gas release unit in the chamber independently of the EUV light focusing mirror.

6. The extreme ultraviolet light generation apparatus according to claim 1, further comprising a shield member separate from the hydrogen gas release unit and located to surround an optical path of extreme ultraviolet light reflected by the EUV light focusing mirror,
wherein the shield member includes a third cooling medium channel through which a cooling medium passes.

7. The extreme ultraviolet light generation apparatus according to claim 1, wherein the hydrogen gas release unit is integrated with a shield located to surround an optical path of extreme ultraviolet light reflected by the EUV light focusing mirror.

8. The extreme ultraviolet light generation apparatus according to claim 1, wherein the first cooling medium channel includes a first part located on a traveling direction side of the extreme ultraviolet light reflected by the EUV light focusing mirror relative to the opening, and a second part located on a side opposite to the traveling direction side relative to the opening.

9. The extreme ultraviolet light generation apparatus according to claim 1, further comprising a hydrogen gas supply unit configured to supply a hydrogen gas to the hydrogen gas release unit.

10. The extreme ultraviolet light generation apparatus according to claim 9, wherein the hydrogen gas release unit includes a hydrogen gas channel through which the hydrogen gas supplied from the hydrogen gas supply unit passes to the opening, and
the hydrogen gas channel is located between the first cooling medium channel and the EUV light focusing mirror.

11. The extreme ultraviolet light generation apparatus according to claim 1, further comprising:
a target supply unit configured to supply a tin droplet to a predetermined region in the chamber; and
a laser beam focusing mirror configured to focus a pulse laser beam on the predetermined region.

12. The extreme ultraviolet light generation apparatus according to claim 11, wherein the opening in the hydrogen gas release unit is located so that radiation heat from the predetermined region directly enters an area around the opening.

13. The extreme ultraviolet light generation apparatus according to claim 1, wherein the hydrogen gas release unit includes a plurality of the openings arranged along an outer periphery of the EUV light focusing mirror, and
the first cooling medium channel is arranged to pass through a section of the hydrogen gas release unit at a plurality of spots, the section of the hydrogen gas release unit passing through the openings.

14. The extreme ultraviolet light generation apparatus according to claim 1, wherein the cooling medium passing through the first cooling medium channel is water.

* * * * *